United States Patent [19]

Kuwabara

[11] Patent Number: 5,233,387
[45] Date of Patent: Aug. 3, 1993

[54] IMAGE RECORDING APPARATUS HAVING FRONT/REAR SHEET FACE SENSOR

[75] Inventor: Satoru Kuwabara, Chiryu, Japan

[73] Assignee: Brother Kogyo Kabushiki Kaisha, Nagoya, Japan

[21] Appl. No.: 854,683

[22] Filed: Mar. 20, 1992

[30] Foreign Application Priority Data

Mar. 22, 1991 [JP] Japan ................... 3-83307

[51] Int. Cl.$^5$ ............................ G03G 21/00
[52] U.S. Cl. ........................... 355/208; 355/308
[58] Field of Search ............... 355/68, 77, 132, 208, 355/204, 321, 308, 309, 316

[56] References Cited

U.S. PATENT DOCUMENTS

| | | |
|---|---|---|
| 4,399,209 | 8/1983 | Sanders et al. |
| 4,825,257 | 4/1989 | Yoshino et al. .............. 355/132 |
| 4,830,501 | 5/1989 | Terashita .................. 355/204 X |
| 5,122,830 | 6/1992 | Imaeda et al. ............. 355/132 X |

Primary Examiner—A. T. Grimley
Assistant Examiner—T. A. Dang
Attorney, Agent, or Firm—Oliff & Berridge

[57] ABSTRACT

An image recording apparatus which records an image of an original document on an image receiving sheet with the use of a photosensitive recording medium, the image receiving sheet having front and rear faces differing in reflection ratio. To detect error in sheet face orientation, a sheet face sensor unit is provided upstream of a pressure developing unit which discriminates a face of the image receiving sheet. The sensor unit includes a light emitting element for emitting light toward the face of the image receiving sheet and a light receiving element for receiving light emitted from the light emitting element and reflected on the face of the image receiving sheet. A central processing unit computes a reflection ratio based on the data supplied thereto and produces a discrimination signal indicative of the face of the image receiving sheet based on the reflection ratio being computed. A predetermined number of most recently detected data regarding light receiving amount at the light receiving element and the associated discrimination signals are accumulated in a memory. On the basis of the accumulated data, a threshold value for determining the face of the image receiving sheet or the light emission amount of the light emitting element is set.

5 Claims, 4 Drawing Sheets

IMAGE RECORDING APPARATUS HAVING FRONT/REAR SHEET FACE SENSOR

BACKGROUND OF THE INVENTION

1. Field of the Invention

The present invention relates generally to image recording apparatuses, and more particularly to an image recording apparatus having a front/rear sheet face sensor for detecting a recording sheet being fed in upside down.

2. Description of the Prior Art

Various types of image recording apparatuses have heretofore been developed and used. One uses a photosensitive pressure-sensitive microcapsule sheet and an image receiving sheet wherein the microcapsule sheet is exposed to an imaging light to selectively photocure microcapsules to thus form a latent image thereon. The exposed microcapsule sheet is brought to facial contact with the image receiving sheet and a pressure is applied thereto in a pressure developing unit, with the result that the microcapsules which remain uncured are ruptured and chromogenic materials released therefrom react with a developer material coated on the image receiving sheet, thereby forming a visible output image on the image receiving sheet.

Since only one side of the image receiving sheet is coated with the developer material, feeding of the sheets into the apparatus is not reversible. If the sheet is fed upside down, no visible image is produced. Further, paper jam and machine troubles tend to occur resulting from an sheet face orientation error.

Figure 1:
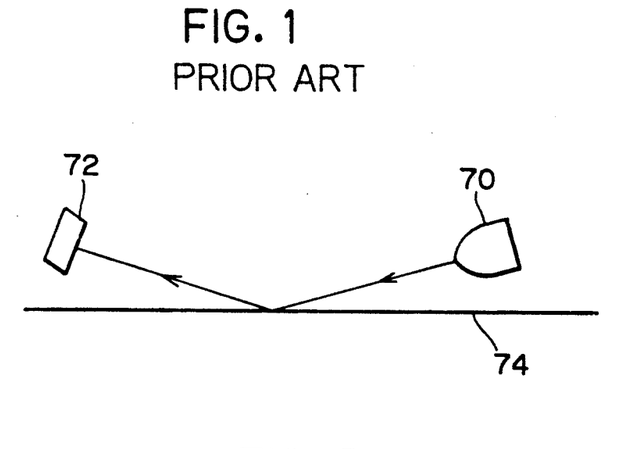
FIG. 1 is an explanatory diagram illustrating a conventional sheet face sensor unit.

To obviate such troubles, it has been proposed to provide a sheet face sensor unit alongside a sheet conveying path. As shown in FIG. 1, the sensor unit includes a light emitting element 70 for emitting a light toward the surface of a recording sheet 74, and a light receiving element 72 disposed to receive the light reflected from the recording sheet 74. Based on an amount of light received at the light receiving element 72, the front or rear face of the sheet 74 is identified.

However, a sheet face identification error tends to occur after a long-term use of the apparatus due to change in amount of light emitted from the light emitting element or received at the light receiving element caused by aging or dust deposited on these elements.

SUMMARY OF THE INVENTION

The present invention has been made to solve the above-described problems, and accordingly it is an object of the present invention to provide an image recording apparatus having a sheet face sensor unit which can identify the front or rear face of the sheet with high accuracy based on an amount of light reflected from the sheet face.

To achieve the above and other objects there is provided an image recording apparatus for recording an image of an original document on an image receiving sheet with the use of a photosensitive recording medium. The image receiving sheet has front and rear faces differing in reflection ratio. The apparatus includes exposure means for exposing a photosensitive recording medium with an imaging light to form a latent image thereon, first conveying means for conveying the photosensitive recording medium, second conveying means for conveying the image receiving sheet along a sheet conveying path, developing means for developing the latent image and forming a visible image on the image receiving sheet, and thermal fixing means for thermally fixing the visible image formed on the image receiving sheet. There is provided discrimination means disposed alongside of the sheet conveying path and upstream of the developing means with respect to a direction in which the image receiving sheet is conveyed. The discrimination means discriminates the face of the image receiving sheet and outputs a discrimination signal indicative of either the front or rear face of the image receiving sheet. The discrimination means includes a light emitting element for emitting light toward the face of the image receiving sheet and a light receiving element for receiving light emitted from the light emitting element and reflected on the face of the image receiving sheet. The face of the image receiving sheet is discriminated by comparing data regarding an amount of light received at the light receiving element with a threshold value. The amount of light received at the light receiving element is detected each time when the image receiving sheet passes the sheet conveying path. There is further provided storage means for storing at least data regarding the amount of light received at the light receiving element and associated discrimination signals obtained through a predetermined number of most recent detections. Control means controls the discrimination performed by the discrimination means by changing the threshold value through reading of the data out of the storage means and computation of the read data. Specifically, the control computes an average of a preselected number of the light receiving amounts at the light receiving element when associated discrimination signals indicate the rear face of the image receiving sheet. Similarly, the control means computes an average of a preselected number of the light receiving amounts when associated discrimination signals indicate the front face of the image receiving sheet. The control means sets a new threshold value so that the discriminating means can compare data regarding the amount of light received at the light receiving element with the new threshold value. The new threshold value is set to one half of a difference between data obtained from the first and second computing means.

In accordance with another aspect of the present invention there is provided an image recording apparatus including exposure means, first conveying means, second conveying means, developing means, thermal fixing means, and discrimination means as described above. The apparatus further includes storage means for storing at least data regarding an amount of light emitted from the light emitting element, data regarding the amount of light received at the light receiving element, and associated discrimination signals. The data regarding the light emitting amount and the light receiving amount, and the discrimination signals are obtained through a predetermined number of most recent detections. Control means controls an amount of light emitted from the light emitting element based on an average of data regarding a preselected number of light receiving amounts when the associated discrimination signals indicate the rear face of the image receiving sheet. Specifically, the control means computes an average of a preselected number of the light receiving amounts when associated discrimination signals indicate the rear face of the image receiving sheet, and then computes an optimum amount of light to be emitted from the light emitting element based on data obtained from the first computing means and data regarding the light emission amount.

BRIEF DESCRIPTION OF THE DRAWINGS

The particular features and advantages of the present invention as well as other objects will become apparent from the following description taken in connection with the accompanying drawings, in which.

DETAILED DESCRIPTION OF THE PREFERRED EMBODIMENT

A basic construction of an image recording apparatus to which the present invention is applied will be described with reference to FIG. 2.

Figure 2:
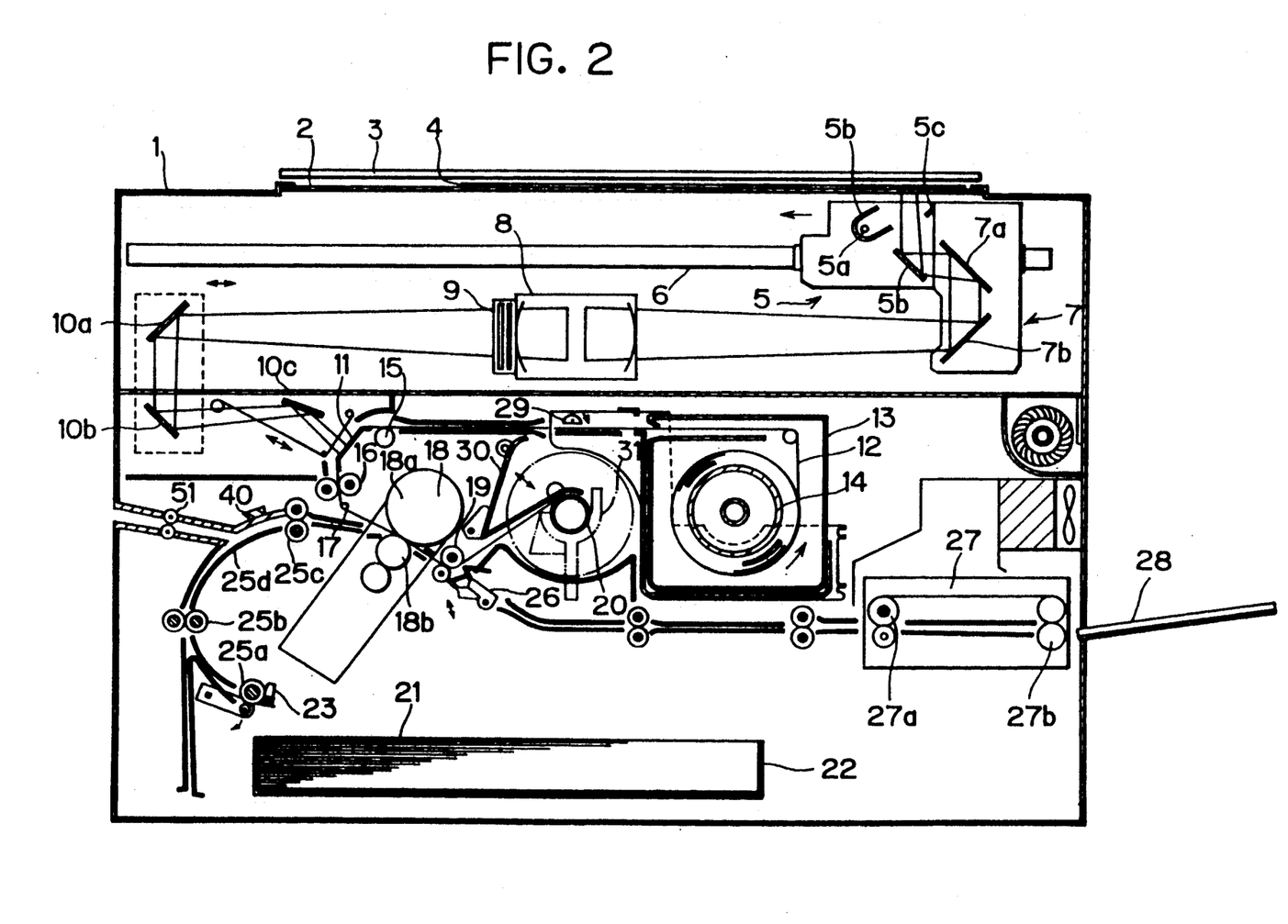
FIG. 2 is a vertical cross-sectional view showing an image recording apparatus according to an embodiment of the present invention.

FIG. 2 shows an overall structure of the image recording apparatus 1 which generally employs an elongated, web-like photosensitive pressure-sensitive image recording sheet (hereinafter referred to as "microcapsule sheet") 12 and a cut form image receiving sheet (hereinafter referred to as "developer sheet") 21. The microcapsule sheet 12 has a substrate whose surface is coated with an immense number of pressure-rupturable microcapsules encapsulating therein chromogenic materials reactable with a developer material coated over a substrate of the developer sheet 21. By this reaction, an output color image is formed on the developer sheet 21. Details of these image recording media are disclosed in U.S. Pat. No. 4,399,209, and therefore, further description thereof is omitted herein.

At a top portion of the image recording apparatus 1, a transparent original support glass 2 is provided for placing an original document 4 thereon, and a cover 3 is pivotally disposed over the original support glass 2. Between the support glass 2 and the cover 3, the original document 4 is positioned with its imaged surface face down.

An optical unit 5 is provided below the original support glass 2, which includes a halogen lamp 5a, a reflector 5b, and reflection mirrors 5c and 5d. The optical unit 5 is reciprocally movable along a shaft 6 extending in parallel to the original support glass 2. The optical unit 5 irradiates light on a line-to-line basis toward the original support glass 2. The light passed through the original support glass 2 is reflected from the imaged surface of the original document 4, thereby providing an imaging light.

A mirror unit 7 having mirrors 7a and 7b is provided below the original support glass 2. The mirror unit 7 is also reciprocally movable along the shaft 6. The imaging light from the original document 4 is reflected on the mirrors 5d, 7a and 7b and directed toward a direction in parallel to the direction in which the optical unit 5 moves.

A projection lens 8 and a filter unit 9 are fixedly disposed on a path of the imaging light. The filter unit 9 is provided to adjust a color tone of the reproduced color image. At downstream side of the filter unit 9, there are provided a pair of reflection mirrors 10a, 10b for reversing the direction of the imaging light. An exposure stand 11 is provided at the rightside of the mirror 10b for exposing the microcapsule sheet 12 to the imaging light. A reflection mirror 10c is disposed between the mirror 10b and the exposure stand 11 for deflecting the imaging light. By the exposure of the imaging light onto the microcapsule sheet 12 which is moving while being supported on the exposure stand 11, a latent image corresponding to the image of the original document 4 is formed on the microcapsule sheet 12. The latent image can be enlarged or reduced by moving the reflection mirrors 10a, 10b toward and away from the filter unit 9. When an equi-magnification copy is made, the reflection mirrors 10a, 10b are fixed to predetermined positions.

At the center portion of the apparatus 1, a microcapsule sheet's cartridge 13 is detachably provided in which an elongated, web like microcapsule sheet 12 is stored in a rolled state. The microcapsule sheet 12 is wound around a supply shaft 14. Within the cartridge 13, a sector roller 29 is provided for drawing the microcapsule sheet 12 out of the cartridge 13 and feeding the same toward the exposure stand 11 along a predetermined sheet path. A pair of feed rollers 16 are rotatably provided at positions downstream of the exposure stand 11. A counterpart of the feed roller 16 is movable toward and away from the remaining feed roller 16. The microcapsule sheet 12 is fed by the feed rollers 16 and extended to a takeup shaft 20 via a pressure developing unit 18 and a separation roller 19. Between the feed rollers 16 and the pressure developing unit 18, a dancer roller or a tension control roller 17 is provided for eliminating a sheet slack of the microcapsule sheet 12. The separation roller 19 is provided downstream of the pressure developing unit 18 for separating the microcapsule sheet 12 from a developer sheet 21 to be described later. To summarize, the microcapsule sheet 12 drawn out of the cartridge 13 is extended to pass through the exposure stand 11 and the pressure developing unit 18 and is wound around the takeup shaft 20. The microcapsule sheet 12 drawn out from the cartridge 13 is prevented from being exposed to unwanted light before reaching the exposure stand 11 by virtue of light shielding walls.

The pressure developing unit 18 includes a large-diameter roller 18a and a small-diameter backup roller 18b. Below the pressure developing unit 18, there is provided a sheet cassette 22 in which the developer sheets 21 are stacked normally with its developer material coated surface face down. A suction type sheet feeding mechanism 23 is provided for feeding out the uppermost developer sheet 21 one by one from the sheet cassette 22 upon sucking the developer sheet with negative pressure. A guide plate 25d, feed rollers 25a, 25b, 25c and a sheet face sensor 40 are disposed along a conveyance path of the developer sheet 21. The developer sheet 21 is conveyed into the pressure developing unit 18 while being guided by the guide plate 25d. On way to the pressure developing unit 18, the developer sheet 21 passes below the sheet face sensor 40. A manual insertion port 51 is formed at left side of the apparatus 1 so as to merge the conveyance path of the developer sheet 21 so that the developer sheet 21 can be manually inserted from the manual insertion port 51. To form a visible image on the developer sheet 21, it must be inserted from the manual insertion port 51 with its developer material coated surface face up.

The microcapsule sheet 12 and the developer sheet 21 are brought into facial contact with each other and the two sheets held in superposed relation pass through a nip between the rollers 18a, 18b of the pressure developing unit 18 where the microcapsules which remain uncured are ruptured and the chromogenic materials released from the ruptured microcapsules react with the developer material. Thus, the latent image formed on the microcapsule sheet 12 is developed and a visible image is formed on the developer sheet 21. In downstream of the pressure developing unit 18, a thermal fixing unit 27 is provided which includes heat rollers 27a for heating the developer sheet 21 and discharge rollers 27b, where the visible image is thermally fixed on the developer sheet 21 by virtue of the heat rollers 27a. The developer sheet 21 is then discharged out of a discharge tray 28 by the discharge rollers 27a. At a position above the thermal fixing unit 27, provided are a deodorization filter for absorbing gaseous component released from the developer sheet 21 and generated at the time of thermal fixing operation and a fan for directing gaseous odor toward the filter.

The apparatus 1 has an automatic sheet loading feature wherein the leader tape portion affixed to the free end portion of the microcapsule sheet 12 is automatically drawn out of the cartridge 13, extended to pass the sheet path, and is wound around the takeup shaft 14. By this feature, loading of the microcapsule sheet 12 can be automatically accomplished. To this end, a separation chute 26 is pivotably provided at a position immediate downstream of the separation roller 19 so as to direct the leader tape portion of the microcapsule sheet 12 toward the takeup shaft 20. To smoothly perform the winding operation of the microcapsule sheet 12 around the takeup shaft 20, an upper guide 30 and a lower guide 31 are provided immediately above and below the takeup shaft 20, respectively. For loading the microcapsule sheet 12 on the sheet path, the upper guide 30, the lower guide 31 and the separation chute 26 are moved to positions indicated by dotted chain lines in FIG. 2 for letting the leader tape portion be wound around the takeup shaft 20. On the other hand, when the loading operation is complete, these are moved to positions indicated by solid lines in FIG. 2, so that image recording operation is achievable.

Figure 3:
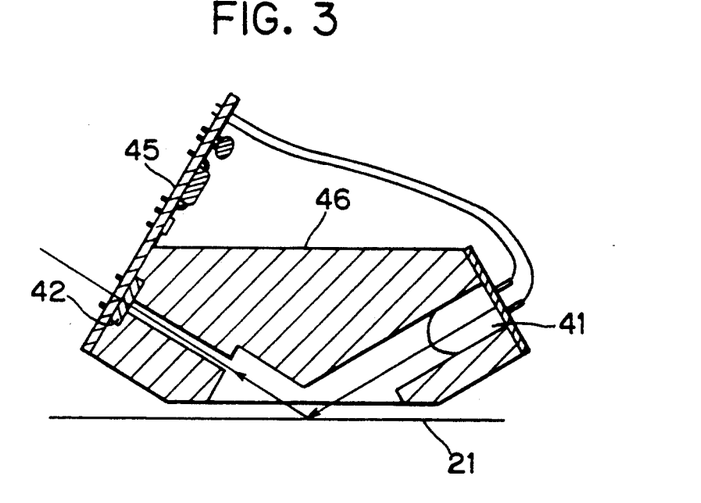
FIG. 3 is a vertical cross-sectional view showing a sheet face sensor unit according to an embodiment of the present invention.
Figure 4:
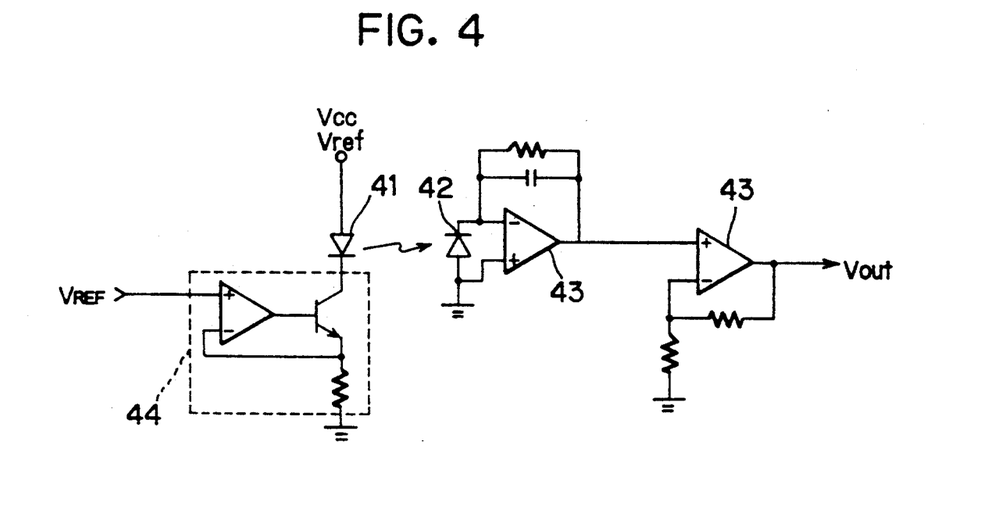
FIG. 4 is a circuit diagram illustrating the sheet face sensor unit according to the embodiment of the present invention.

Referring to FIGS. 3 and 4, details of the sheet face sensor 40 will be described.

As shown in FIG. 3, the sheet face sensor 40 has a block 46 indicated by oblique lines. The block 46 is formed with a light projection path 46a extending obliquely downwardly from the right upper portion of the block 46, an opening 46b at the lower portion of the block 46, and a light receiving path 46c extending obliquely upwardly to the left upper portion of the block 46 from the opening. A light emitting element 41 is attached to the right slanted face of the block 46 to emit light inwardly of the light projection path 46a. The light is incident upon the developer sheet 21 at an angle of 60 degrees and reflected therefrom at the same angle. The reflected light goes through the light receiving path 46c.

An electronic substrate 45 is attached to the left slanted face of the block 46, on which a light receiving element 42 is mounted to receive the reflected light. An electric circuit of the sheet face sensor 40 is shown in FIG. 4. The circuit includes a constant current circuit 44 for supplying a constant current to the light emitting element 41. The constant current circuit 44 is made up of an operational amplifier 44a, a PNP transistor 44b and a resistor 44c. The non-inverting input terminal of the operational amplifier 44a is applied with a reference voltage $V_{ref}$ and the inverting input terminal thereof is connected to the emitter of the transistor 44b. The output terminal of the operational amplifier 44a is connected to the base of the transistor 44b. The emitter of the transistor 44b is grounded through the resistor 44c. The collector of the transistor 44b is connected through the light emitting element 41 to a d.c. power supply $V_{cc}$.

The output current $I_O$ of the operational amplifier 44a is at constant whose level is determined by the reference voltage $V_{ref}$ and the resistance of the resistor 44c, i.e., $I_O = V_{ref}/R_{44c}$ where $R_{44c}$ is the resistance of the resistor 44c. With the constant current $I_O$ applied to the base of the transistor 44b, a constant current flows in the collector of the transistor 44b. Consequently, the light emitting element 41 emits a larger amount of light if the value of $V_{ref}$ is increased.

The light receiving element 42 disposed to receive the light reflected from the developer sheet 21 is connected across the non-inverting and inverting input terminals of a second operational amplifier 43. A parallel-connection of a resistor 43a and a capacitor 43b serving as an integration circuit is connected across the non-inverting input terminal and the output terminal of the second operational amplifier 43. A minute current flowing through the light receiving element 42 is integrated by the integration circuit, thereby providing a stable output. The output terminal of the second operational amplifier 43 is connected to the non-inverting input terminal of a third operational amplifier 47. A resistor 47a is connected across the output terminal and the inverting input terminal of the third operational amplifier 47. The inverting input terminal of the third operational amplifier 47 is connected through a resistor 47b to ground. An inversion amplifier is configured by the third operational amplifier 47 and its associated elements, wherein a small output current from the second operational amplifier 43 is amplified and an output signal $V_{OUT}$ is developed at the output terminal of the third operational amplifier 47. The output signal $V_{OUT}$ is applied through an analog-to-digital converter 50 to a central processing unit (CPU) 52 as shown in FIG. 5.

Figure 5:
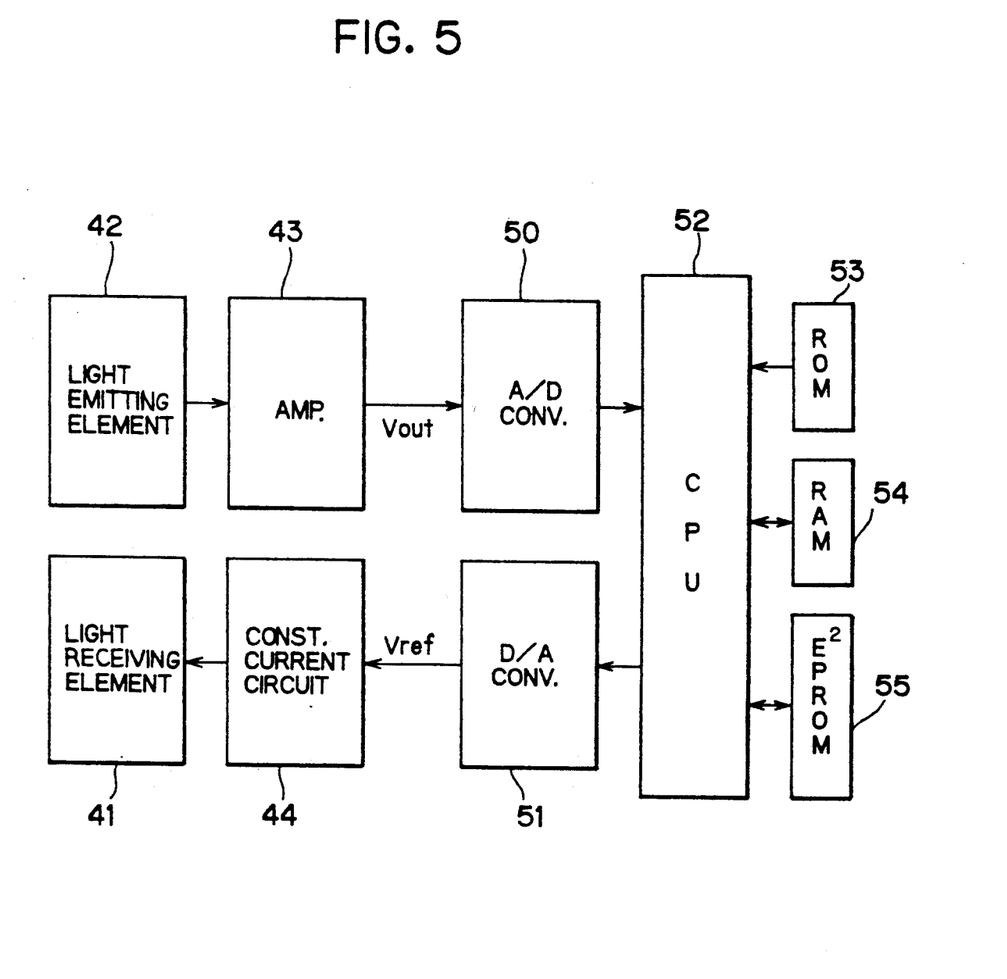
FIG. 5 is a block diagram illustrating a controller according to the present invention.

FIG. 5 is a block diagram showing a controller incorporated in the image recording apparatus 1 of the present invention. The controller includes the CPU 52, a read-only memory (ROM) 53, a random access memory (RAM) 54, and an electrically erasable read-only memory (EEPROM) 55. As described, the light receiving element 42 is coupled to the CPU 52 through the circuit depicted in FIG. 4 and the A/D converter 50 as described. Further, the light emitting element 41 is connected to the CPU 52 through a digital-to-analog (D/A) converter 51, and the constant current circuit 44 depicted in FIG. 4. Due to the fact that characteristics of light emission amount vs. reference voltage $V_{ref}$ and light receiving amount vs. output signal $V_{out}$ are substantially linear, a reflection ratio of the developer sheet 21 can be computed based on the reference voltage $V_{ref}$ and the output signal $V_{out}$. The front or rear face of the developer sheet 21 can therefore be determined based on the reflection ratio thus computed. A sheet face discrimination signal indicative of the detected face of the developer sheet 21 is produced from the CPU 52.

The EEPROM 55 stores digital signals corresponding to the reference voltage $V_{ref}$ which indicates light emission amount from the light emitting element 42, the output voltage from the sensor circuit which indicates light receiving amount at the light receiving element 41, and the sheet face discrimination signal. A predetermined number of most recent digital signals corresponding to each of the reference voltage $V_{ref}$ and the output voltage $V_{out}$, and the sheet face discrimination signal are accumulated in the EEPROM 55. Whenever new data are obtained, the accumulated data are updated in such a manner that the oldest data are erased and the most recent data are stored.

Figure 6A:
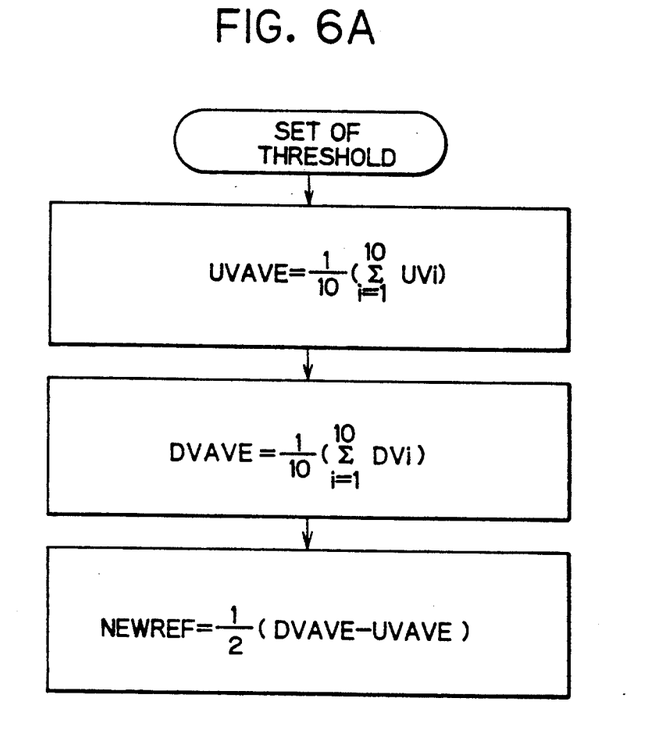
FIGS. 6A and 6B are flow charts illustrating control sequences executed by a central processing unit of a controller.
Figure 6B:
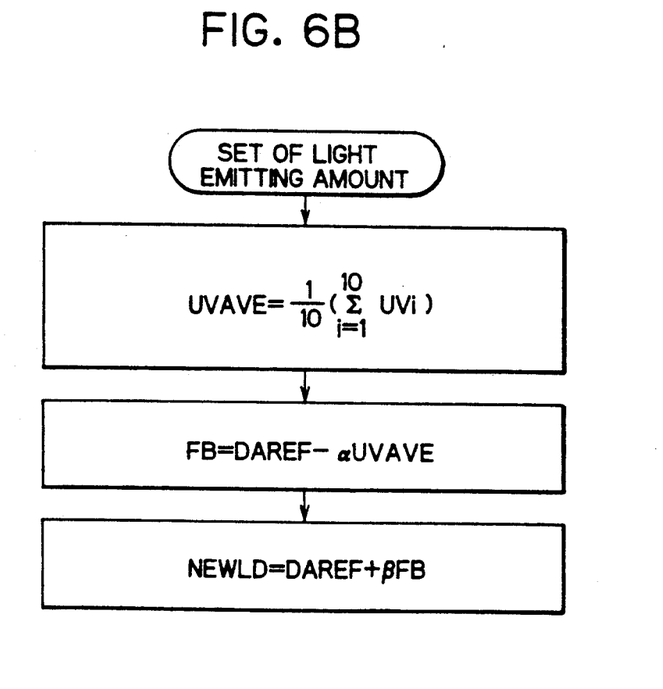

FIGS. 6A and 6B are flow charts illustrating control processes executed by the CPU 52 so as to perform appropriate sheet face discrimination taking the change of light emission amount and/or light receiving amount into consideration. FIG. 6A illustrates a process of computing a new threshold value NEWREF used for determining the face of the developer sheet 21. Firstly, an average UVAVE of the digital signals UVi which correspond to the analog output signals $V_{out}$ obtained when the face of the developer sheet 21 is determined as being rear is computed based on the most recent ten pieces of data accumulated in the EEPROM 55. Similarly, an average DVAVE of the digital signals DVi which correspond to the analog output signals $V_{out}$ obtained when the face of the developer sheet 21 is determined as being front is computed based on the most recent ten pieces of data accumulated in the EEPROM 55. Then, a computation is performed to obtain the new threshold value NEWREF by dividing a difference of DVAVE and UVAVE by two. When a new developer sheet 21 passes below the sheet face sensor 40 after the new threshold value NEWREF is set, a digital signal corresponding to an amount of light received at the light receiving element 42 is compared with the new threshold value NEWREF to thereby carry out sheet face discrimination and to update the data stored in the EEPROM 55.

FIG. 6B illustrate a process of determining a new reference voltage $V_{ref}$ applied to the constant current circuit 44 shown in FIG. 4 to appropriately change an amount of light emitted from the light emitting element 41. To this end, an average UVAVE of the digital signals UVi which correspond to the analog output signals $V_{out}$ obtained when the face of the developer sheet 21 is determined as being rear is computed based on the most recent ten pieces of data accumulated in the EEPROM 55. Upon obtaining the value UVAVE, a feedback amount FB is computed in accordance with the following equation:

$$FB = DAREF - \alpha UVAVE$$

where DAREF is a digital value indicative of the immediate preceding reference voltage $V_{ref}$ and $\alpha$ is a correction factor for translating the value of UVAVE into the corresponding digital value of the reference value $V_{REF}$. Note that in this embodiment, the threshold value for determining the face of the developer sheet 21 is remained unchanged. Based on the values DAREF and FB, a new digital value corresponding to the reference value $V_{ref}$ is determined in accordance with the following equation:

$$NEWLD = DAREF \beta FB$$

where $\beta$ is a correction factor. The thus obtained new digital is subjected to digital-to-analog conversion in the D/A converter 51 to produce a new reference voltage $V_{ref}$.

Selected one of the processes illustrated in FIGS. 6A and 6B can be used independently of each other or both processes can be used interchangeably to achieve a highly reliable sheet face discrimination. It is to be noted that the EEPROM 55 initially stores preselected values so that the above described processes can be carried out even if the past detection data are not accumulated.

Operation of the apparatus 1 will next be described. If the cartridge 13 is mounted on the apparatus 1, the automatic sheet loading operation will be initiated. The sector roller 29 is rotated so as to draw the leader tape portion of the microcapsule sheet 12 out of the cartridge 13 to deliver it to the feed rollers 16. Then, the rotation of the feed roller 29 is stopped whereas the feed rollers 16 are driven to further feed the leader tape portion toward the pressure developing unit 18. In this case, the separation chute 26, the upper guide 30 and the lower guide 31 are moved to positions indicated by one dotted chain lines in FIG. 2, so that the leader tape portion can be directed to the takeup shaft 20 and is wound therearound. Upon completion of the automatic sheet loading, the upper guide 30, the lower guide 31 and the separation chute 26 are moved to their solid line positions shown in FIG. 2 for performing the image recording operation.

If a copy start key (not shown) is depressed, the reflection mirror 5d and the halogen lamp 5a move at a speed of V/m, and the reflection mirrors 7a, 7b move at a speed of V/2m assuming that the microcapsule sheet 12 is fed at a speed of V to form an image at a magnification of m. Since the feeding speed of the microcapsule sheet 12 is synchronized with the moving speeds of the mirrors 5d, 7a, 7b, a latent image is formed on the microcapsule sheet 12 on a line-to-line basis when it passes over the exposure stand 11. This moving sped ratio is provisionally set in accordance with the selected magnification m.

The microcapsule sheet 12 which carries the latent image is further transferred toward the pressure developing unit 18, and at the same time, the developer sheet 21 is fed thereto by the sheet feed mechanism 23 and the feed rollers 25a, 25b, 25c. When the developer sheet 21 passes below the sheet face sensor 40, the reflection ratio of the confronting surface of the developer sheet 21 is computed. If the computed results indicate the sheet face orientation error, the developer sheet 21 is reversely moved or a display (not shown) on a panel indicates occurrence of the error. Details of such error process are disclosed in copending U.S. application Ser. No. 07/692,912 filed Apr. 29, 1991, thus further description thereof is omitted herein. When the computes results indicate that the developer sheet 21 is delivered with correct sheet face orientation, the developer sheet 21 is allowed to enter into the pressure developing unit 18. The latent image formed surface of the microcapsule sheet 12 is superposed on the developer material coated surface of the developer sheet 21 at the pressure developing unit 18, and these are pressed together. Therefore, unexposed microcapsules are ruptured to provide a chromogenic reaction with the developer materials of the developer sheet 21, to thereby form a visible color image on the developer sheet 21.

The microcapsule sheet 12 passed through the pressure developing unit 18 is separated from the developer sheet 21 by the separation roller 19 and is fed toward the takeup shaft 20. On the other hand, the developer sheet 21 is fed to the thermal fixing unit 27 where the coloring of the visible image is promoted by the heat rollers 27a. The thus treated developer sheet 21 is discharged out of the thermal fixing unit 27 by virtue of the discharge rollers 27b and is fed onto the discharge tray 28.

Although the present invention has been described with respect to specific embodiments, it will be appreciated by one skilled in the art that a variety of changes and modification may be made without departing from the scope and spirit of the invention. For example, the computations in the flow charts of FIGS. 6A and 6B can be performed by giving appropriate weights to particular data.

What is claimed is:

1. An image recording apparatus for recording an image of an original document on an image receiving sheet using a photosensitive recording medium, the image receiving sheet having a front face and a rear face differing in reflection ratio, the apparatus comprising:
    exposure means for exposing a photosensitive recording medium with an imaging light to form a latent image thereon;
    first conveying means for conveying the photosensitive recording medium;
    sheet conveying means for conveying the image receiving sheet along a sheet conveying path;
    developing means for developing the latent image and forming a visible image on the image receiving sheet;
    thermal fixing means for thermally fixing the visible image formed on the image receiving sheet;
    discrimination means disposed alongside of the sheet conveying path and upstream of said developing means with respect to a direction in which the image receiving sheet is conveyed, for discriminating between the front face and the rear face of the image receiving sheet and outputting a discrimination signal indicative of either the front face or the rear face of the image receiving sheet, said discrimination means including a light emitting element for emitting light toward a said face of the image receiving sheet and a light receiving element for receiving light emitted from said light emitting element and reflected on the said face of the image receiving sheet wherein the said face of the image receiving sheet is discriminated by comparing data regarding an amount of light received at said light receiving element with a threshold value, the amount of light received at said light receiving element being detected each time when the image receiving sheet passes the sheet conveying path;
    storage means for storing at least data regarding the amount of light received at said light receiving element and associated discrimination signals obtained through a predetermined number of most recent detections; and
    control means for controlling the discrimination performed by said discrimination means by changing the threshold value through reading of the data out of said storage means and computation of the read data.

2. The image recording apparatus according to claim 1, wherein said control means comprises first computing means for computing an average of a preselected number of amounts of light received at said light receiving element when associated discrimination signals indicate the rear face of the image receiving sheet;
    second computing means for computing an average of a preselected number of amounts of light received at the light receiving element when associated discrimination signals indicative the front face of the image receiving sheet;
    and setting means for setting a new threshold value for said discriminating means to compare data regarding the amount of light received at said light receiving element with the new threshold value, the new threshold value being set to one half of a difference between data obtained from said first computing means and said second computing means.

3. The image recording apparatus according to claim 2, wherein said storage means stores the new threshold value and said control means controls said storage means to update the threshold value when the new threshold value is set by said setting means.

4. An image recording apparatus for recording an image of an original document on an image receiving sheet using a photosensitive recording medium, the image receiving sheet having a front and a rear face differing in reflection ratio, the apparatus comprising:
    exposure means for exposing a photosensitive recording medium with an imaging light to form a latent image thereon;
    first conveying means for conveying the photosensitive recording medium;
    second conveying means for conveying the image receiving sheet along a sheet conveying path;
    developing means for developing the latent image and forming a visible image on the image receiving sheet;
    thermal fixing means for thermally fixing the visible image formed on the image receiving sheet;
    discrimination means disposed alongside of the sheet conveying path and upstream of said developing means with respect to a direction in which the image receiving sheet is conveyed, for discriminating between the front face and the rear face of the image receiving sheet and outputting a discrimination signal indicative of either the front face or the rear face of the image receiving sheet, said discrimination means including a light emitting element for emitting light toward a said face of the image receiving sheet and a light receiving element for receiving light emitted from said light emitting element and reflected on the said face of the image receiving sheet wherein the said face of the image receiving sheet is discriminated by comparing data regarding an amount of light received at said light receiving element with a threshold value, the amount of light received at said light receiving element being detected each time when the image receiving sheet passes the sheet conveying path;
    storage means or storing at least data regarding an amount of light emitted from said light emitting element, data regarding the amount of light received at said light receiving element, and associated discrimination signals, wherein the data regarding the light emitting amount and the light receiving amount, and the discrimination signals are obtained through a predetermined number of most recent detections; and control means for controlling an amount of light emitted from said light emitting element based on an average of data regarding a preselected number of light receiving amounts when the associated discrimination signals indicate the rear face of the image receiving sheet.

5. The image recording apparatus according to claim 4, wherein said control means comprises first computing means for computing an average of a preselected number of amounts of light received at said light receiving element when associated discrimination signals indicate the rear face of the image receiving sheet; and second computing means for computing an optimum amount of light to be emitted from said light emitting element based on data obtained from said first computing means and data regarding the amount of light emitted from the light emitting element.

* * * * *